(12) United States Patent
Lu (10) Patent No.: US 7,663,129 B1
(45) Date of Patent: Feb. 16, 2010

(54) THIN SUBSTRATE PITCH MEASUREMENT EQUIPMENT

(75) Inventor: Pao-Yi Lu, Shulin (TW)

(73) Assignee: Gudeng Precision Industrial Co, Ltd, Shulin (TW)

( * ) Notice: Subject to any disclaimer, the term of this patent is extended or adjusted under 35 U.S.C. 154(b) by 0 days.

(21) Appl. No.: 12/241,436

(22) Filed: Sep. 30, 2008

(30) Foreign Application Priority Data

Aug. 27, 2008 (TW) .............................. 97132634 A (51) Int. Cl.
*G08B 21/00* (2006.01)
(52) U.S. Cl. ............................. 250/559.19; 250/223 R; 340/686.5
(58) Field of Classification Search ............ 250/559.19, 250/223 R; 340/686.5; 414/331
See application file for complete search history.

(56) References Cited

U.S. PATENT DOCUMENTS

| | | | |
|---|---|---|---|
| 5,225,691 A | 7/1993 | Powers et al. | |
| 5,308,993 A | 5/1994 | Holman et al. | |
| 5,418,382 A | 5/1995 | Blackwood et al. | |
| 5,466,945 A | 11/1995 | Brickell et al. | |
| 6,097,492 A | 8/2000 | Kondo et al. | |
| 6,188,323 B1 | 2/2001 | Rosenquist et al. | |
| 6,303,939 B1 | 10/2001 | Chung et al. | |
| 6,514,879 B2 * | 2/2003 | Arghavani et al. | 438/773 |
| 6,795,202 B2 * | 9/2004 | Emoto et al. | 250/559.33 |

* cited by examiner

*Primary Examiner*—Seung C Sohn
(74) *Attorney, Agent, or Firm*—Ming Chow; Sinorica, LLC (57) ABSTRACT

The present invention provides an equipment for measuring the vertical distance or pitch between a plurality of thin substrates inside a container body, including an optical component to transmit a light beam to a thin substrate in the container body and receive light beam reflected from the thin substrate, a scanning device to drive the optical component to move along vertical direction of the thin substrates for measuring the vertical distance or pitch between the plurality of thin substrates in the container body, and a rotation base to carry and rotate the container body to a plurality of angles for the plurality of thin substrates inside the container body to be measured from different angular positions.

25 Claims, 13 Drawing Sheets

THIN SUBSTRATE PITCH MEASUREMENT EQUIPMENT

BACKGROUND OF THE INVENTION

1. Field of the Invention

The present field of the invention is related to a measurement equipment for measuring pitch between thin substrates, and more particularly, to a measurement equipment for measuring pitch between thin substrates placed in the interior of container body from a plurality of different angles or different positions with the container body being rotated.

2. Description of the Prior Art

Figure 1:
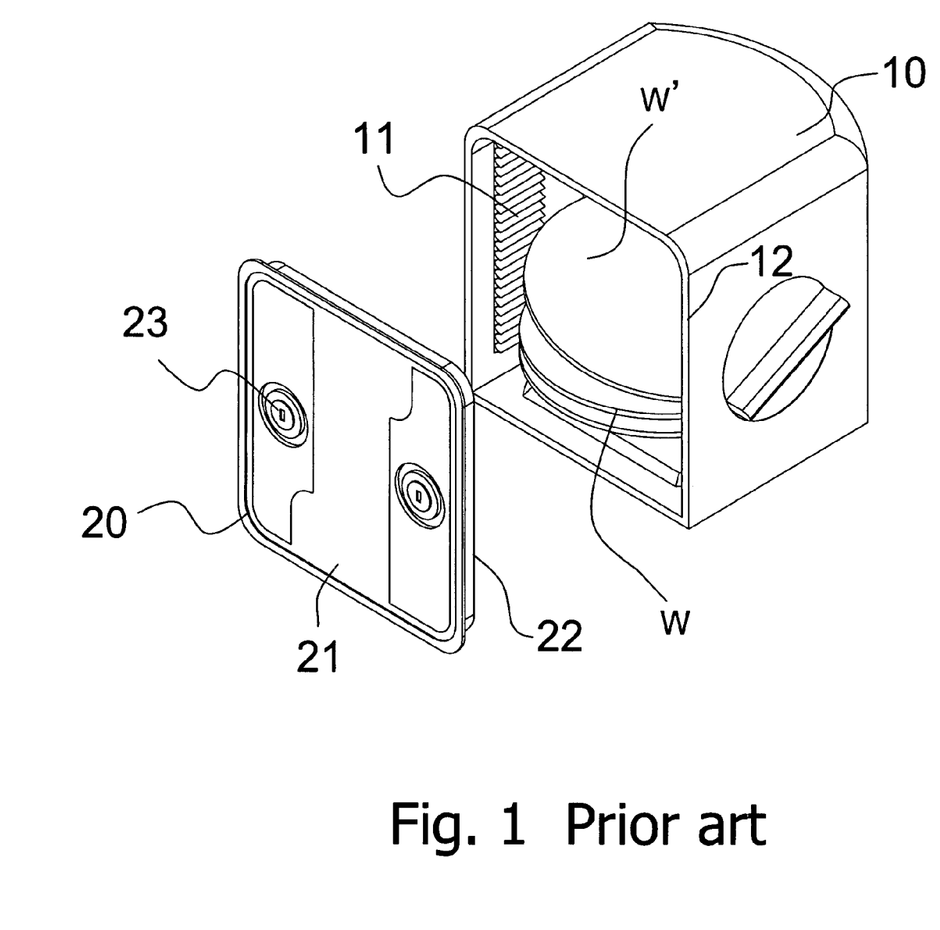
FIG. 1 is a view of a wafer container of the prior art.

The semiconductor wafers are transferred to different stations to apply the various processes in the required equipments. A sealed container is provided for automatic transfer to prevent the pollution from occurring during transferring process. FIG. 1 shows the view of wafer container of the conventional prior art. The wafer container is a front opening unified pod (FOUP) which includes a container body 10 and a door 20. The container body 10 is disposed with a plurality of slots 11 for horizontally supporting a plurality of wafers W, and a front opening 12 is located on a sidewall of the container body 10 for exporting and importing wafers W. Further, the door 20 includes an outer surface 21 and an inner surface 22, wherein the door 20 is joined with the front opening 12 of the container body 10 via inner surface 22 to protect the plurality of wafers W within the container body 10. Moreover, at least a latch hole 23 is disposed on the outer surface 21 of the door 20 for opening or closing the front opening unified pod (FOUP). According to the aforementioned, due to that the wafers are horizontally placed in the container body 10, thus, displacement of wafers W in the container body 10 may occur in the beginning of the process in which wafers are inserted into slots or during the transporting process of wafer container, as shown in Figure in which displaced wafers W' are in slots of different heights. And such displacement of wafers leads easily to damage of other wafers or split-out of wafers when the door 20 is opened.

Figure 2:
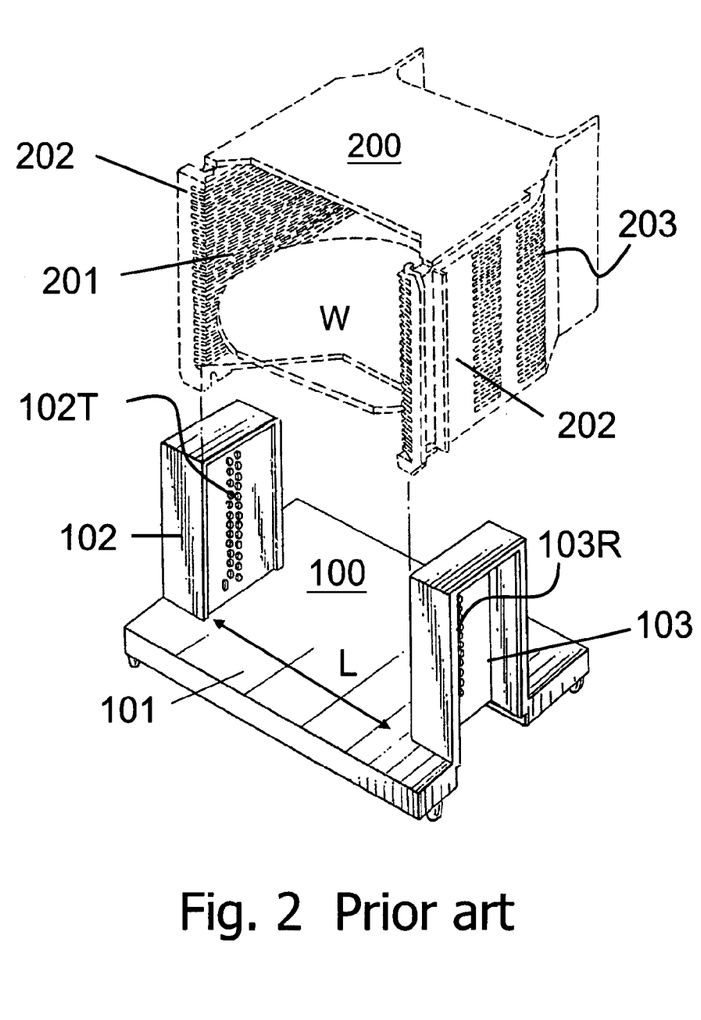
FIG. 2 is a view of a wafer displacement detection system of the prior art.

Referring then to FIG. 2, which is a view of a wafer displacement detection system of conventional prior art. The wafer displacement detection system 100 includes a base 101, a light-transmitting module 102, and a light-receiving module 103. The aforementioned light-transmitting module 102 and light-receiving module 103 are fixed on top of the base 101 at a distance L to allow the placement of wafer cassette 200. Wafer cassette 200 includes 25 pairs of slots 201 for horizontally supporting 25 wafers W. On two sides 202 of wafer cassette 200 are window holes 203 to allow light beams transmitted by a plurality of light-transmitters 102T on light-transmitting module 102 to pass through and also light beams to be received by a plurality of light-receivers 103R on light-receiving module 103. Therefore, when wafers in wafer cassette 200 are displaced or placed in slots of different heights, light beams transmitted by one of the light-transmitters 102T of light-transmitting module 102 will be shielded by this displaced wafer and thus the corresponding light-receiver 103R is not able to receive the light beam. Although the above-mentioned wafer displacement detection system 100 is able to detect abnormal placement of wafers, yet such design seems no longer to correspond with current front opening unified pod (FOUP). In addition, with the size of wafer getting larger and larger, 12" or 18" wafer for example, wafer gravitational sag occurs when wafers are placed in the slots. In other words, the rim of wafers near two sides of slots is higher whereas there is sag or concavity near the central part of wafers. There is an allowable normal range of such sag or concavity; when the degree of sag or concavity exceeds the allowable normal range, wafers crack easily or cause damage to other wafers more easily.

Furthermore, there is also similar problem with LCD; with the size of LCD becomes larger and larger under demand, LCD glass substrates used in the manufacturing process also sags or concaves easily like what is described above. Therefore, a measurement system that is able to perform quantitative measurement on the distance among wafers, LCD glass substrates or other thin substrates (compact disk for example) and the degree of sag or concavity when functioning as support to detect displacement or excessive sag of wafers or thin substrates.

SUMMARY OF THE INVENTION

The design of wafer displacement detection system of prior art cannot fulfill the need of front opening unified pod (FOUP) and only the displacement of wafers can be detected; moreover, the distance between wafers cannot be measured quantitatively, and the excessive sag or concavity of wafers cannot be detected either. In view of these, one objective of the present invention is to provide a thin substrate pitch measurement equipment, which is able to detect displacement of thin substrates in the container body to prevent the displacement from causing damages to other thin substrates or slip-out of thin substrates when the door is opened.

Another objective of the present invention is to provide a thin substrate pitch measurement equipment, which is able to measure the vertical distance between thin substrates; when the distance between thin substrates is not as expected, person in charge of equipment will be notified to prevent the machine arm from causing crack or damages to thin substrates when performing exporting of thin substrates during the following process.

Still another objective of the present invention is to provide a thin substrate pitch measurement equipment, which measures the distance between a single thin substrate and its neighboring thin substrates from different positions and different angles in order to find out in advance where there are problems of excessive sag or concavity of thin substrates and locate the thin substrates that do not meet the standard to prevent the thin substrate from cracking and thus causing damages to other thin substrates.

According to above objectives, the present invention discloses a thin substrate pitch measurement equipment, which includes an optical component, a scanning device, and a rotation base. The rotation base is for carrying container body in which are thin substrates and rotating the container body at least to a certain angle; the optical component includes at least a light-transmitter and a light-receiver, the light-transmitter being used to transmit a light beam to one of the thin substrates in the container body and the light-receiver being used to detect light beam reflected from the thin substrate. The scanning device is for driving the optical component to move along vertical direction of the thin substrates to measure the pitch between these thin substrates. Since the rotation base is able to rotate the container body at least to one certain angle, the optical component is thus able to measure the pitch between a thin substrate and its neighboring thin substrate from different positions or angles on this thin substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In order to disclose the skills applied in, the objectives of, and the effects achieved by the present invention in a more complete and clearer manner, preferred embodiments are herein described below in detail with related drawings disclosed for reference.

Figure 3:
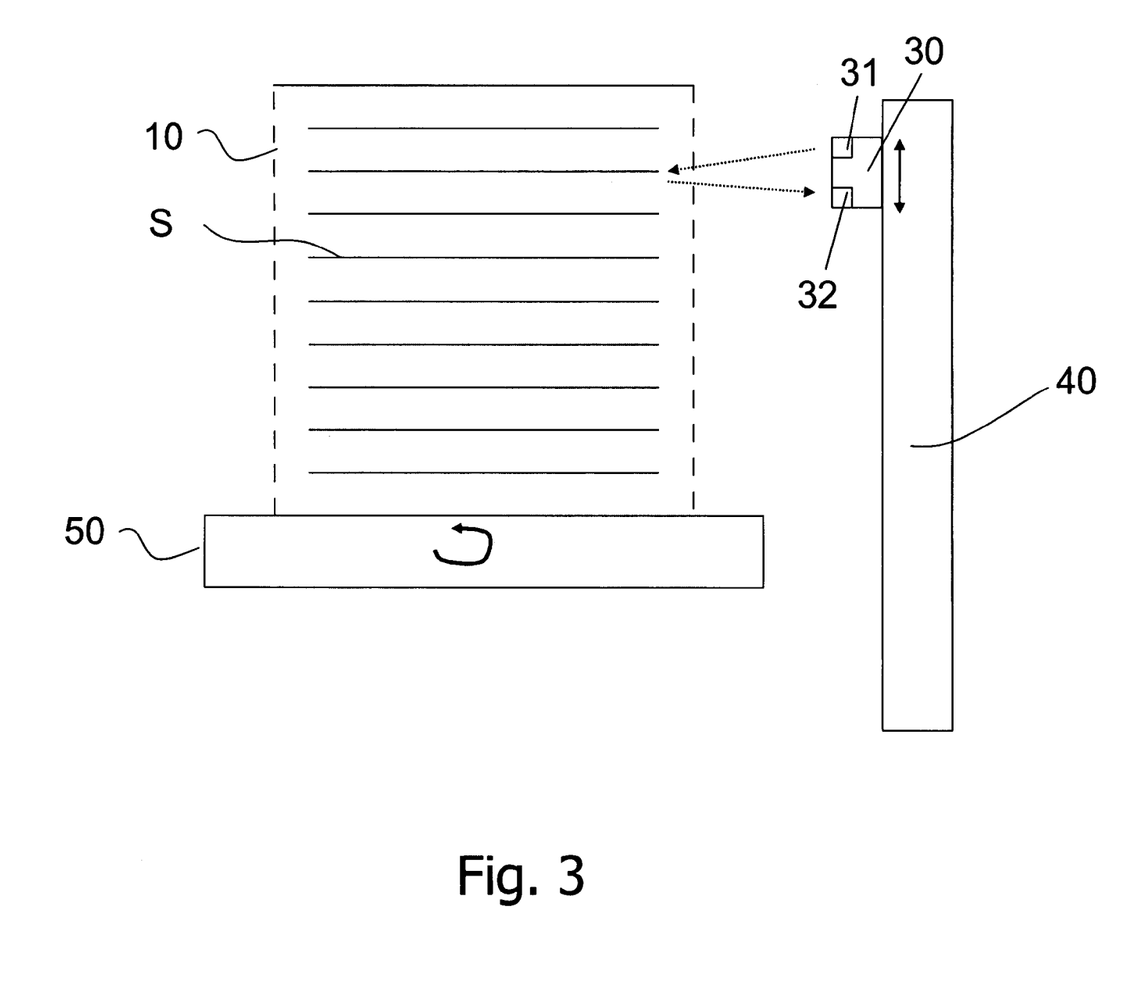
FIG. 3 is a view of a thin substrate pitch measurement equipment of the present invention.

Referring to FIG. 3, which is a view of a thin substrate pitch measurement equipment of the present invention. The thin substrate pitch measurement equipment includes an optical component 30, a scanning device 40, and a rotation base 50, wherein the optical component 30 is disposed on the scanning device 40 and includes at least a light-transmitter 31 and a light-receiver 32, and the rotation base 50 carries a container body 10 having a plurality of thin substrates S within its interior. The light-transmitter 31 of the aforementioned optical component 30 can be used to transmit a light beam to one of the thin substrates S within the interior of the container body and the light-receiver 32 can be used to detect the light beam reflected from the thin substrate S. The scanning device 40 further includes a slide track (not shown in Figure) for the optical component 30 to move along vertical direction of thin substrates S for measuring the pitch between these thin substrates S. Moreover, the rotation base 50 is used not only for carrying container body 10, but also for rotating the container body 10 to at least one certain angle for the optical component 30 to measure the pitch between a thin substrate S and another neighboring thin substrate S from different positions or angles on this thin substrate S. What is to be further emphasized here is that, the rotation base 50 as described above can rotate the container body 10 to at least one certain angle and can rotate more than 360 degrees clockwise or counter-clockwise. The light beam transmitted by the light-transmitter 31 as described above can be laser light, visible light, or infrared light; correspondingly, the light-receiver 32 is also able to receiver these light beams with specific wavelengths. Of course, the wavelengths of light beams transmitted/received by the light-transmitter 31 and light-receiver 32 of the present invention are not limited to those described above, which are used only for illustration and not for limiting the scope of the present invention.

Figure 4A:
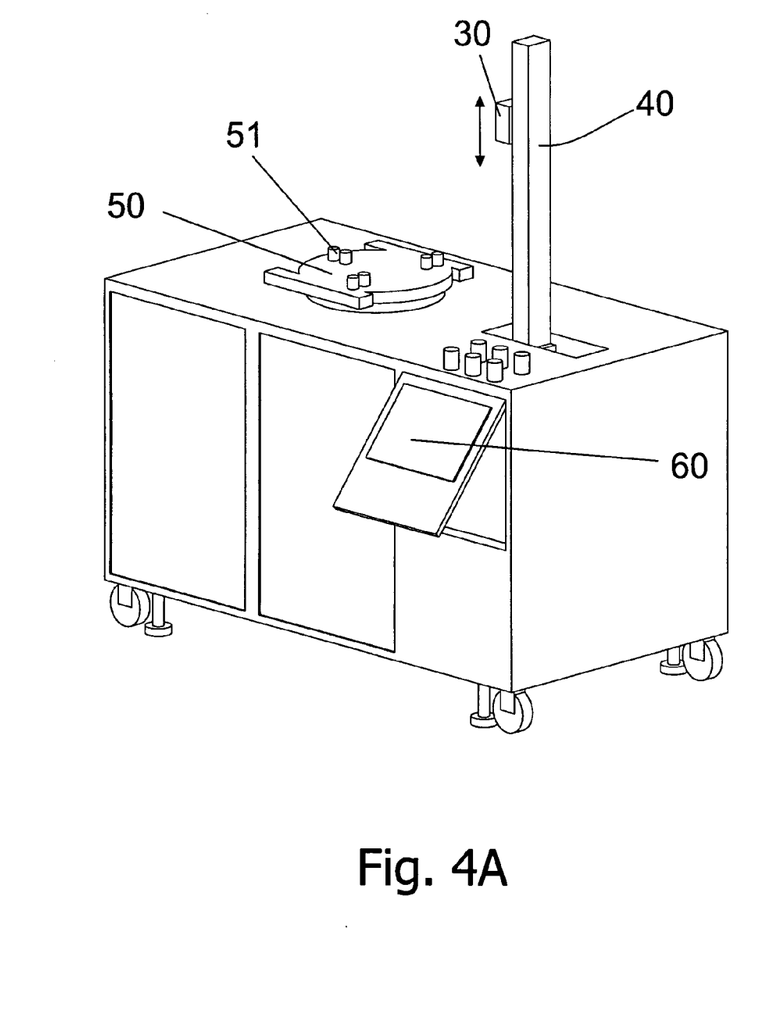
FIG. 4A and FIG. 4B are views of thin substrate container before and after its container body is carried by the rotation base.
Figure 4B:
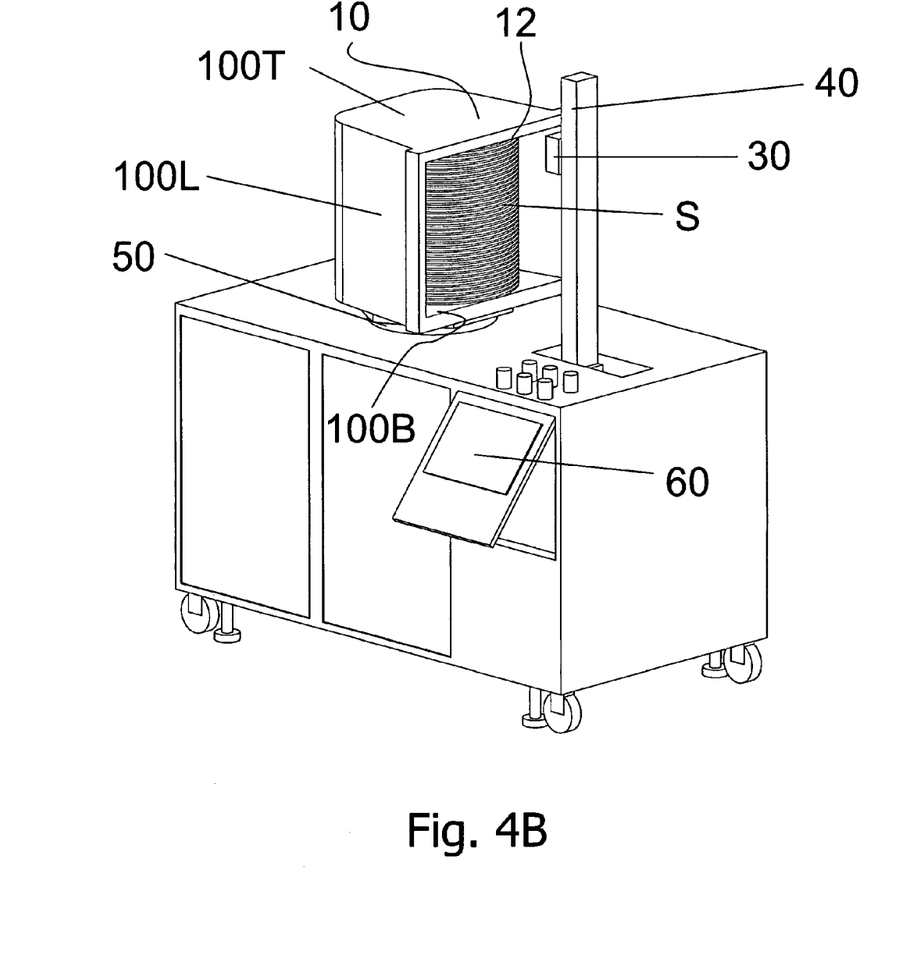
Figure 5A:
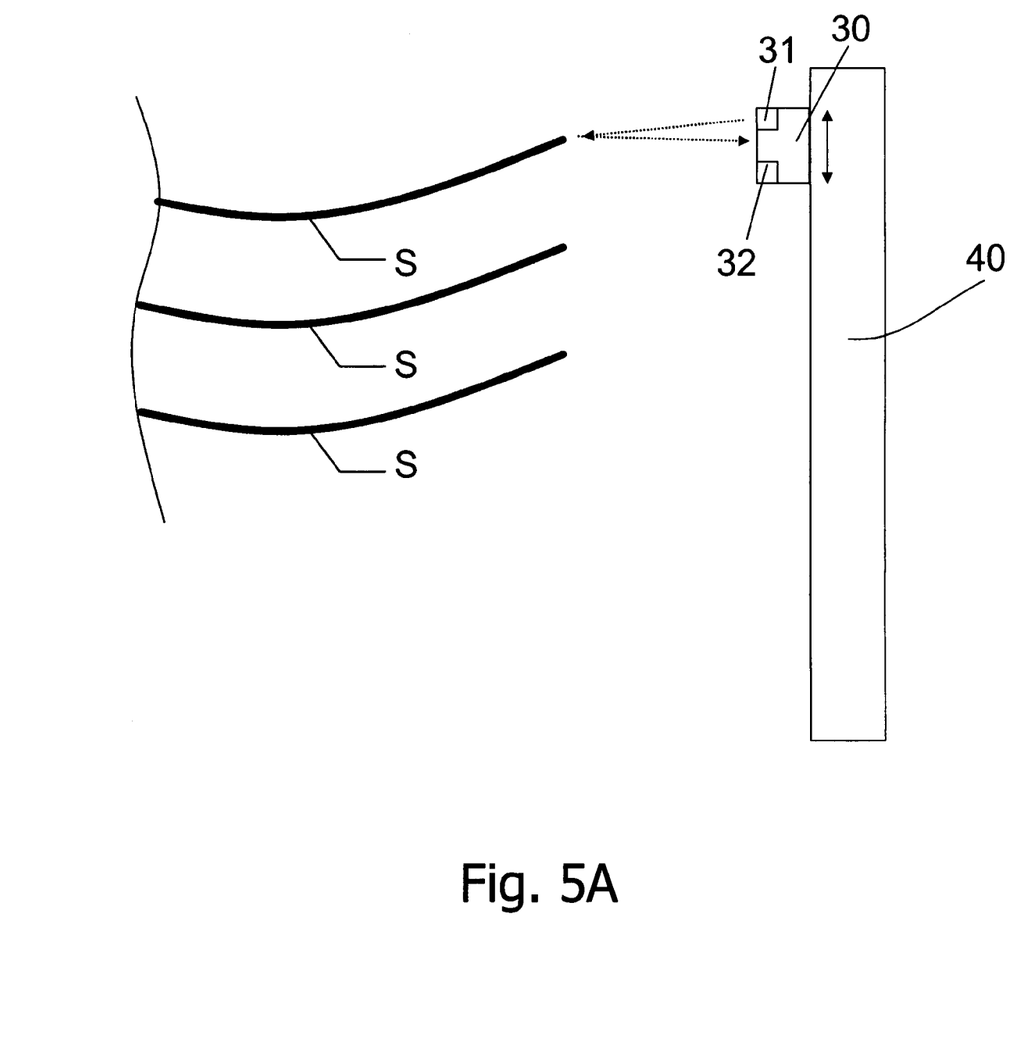
FIG. 5A and FIG. 5B are views of thin substrate pitch measurement equipment of the present invention when measuring pitch between thin substrates.
Figure 5B:
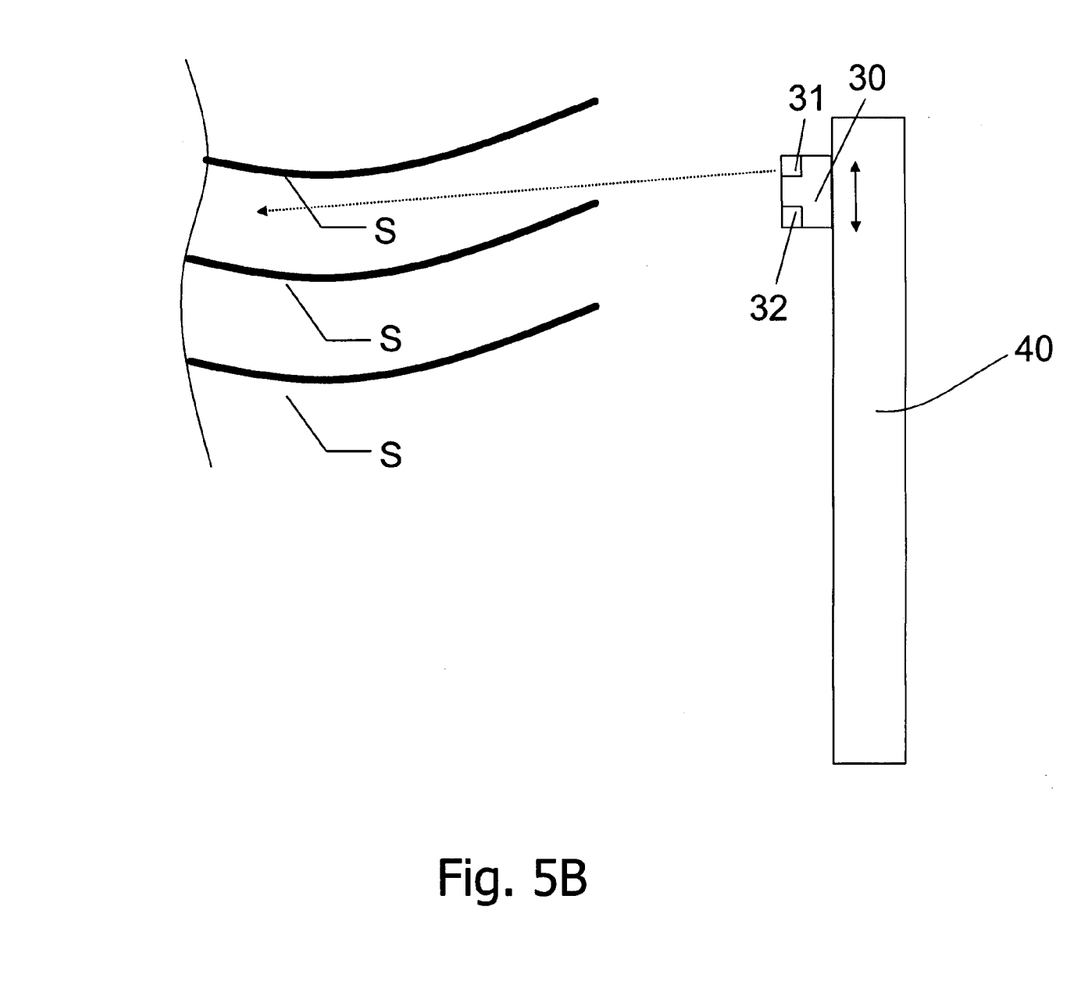

As shown in FIG. 4A and FIG. 4B, which are views of thin substrate container before and after the container body of which is carried by the rotation base. The container body 10 of thin substrate container includes a plurality of sidewalls 100L, a top wall 100T, and a base 100B, wherein a front opening 12 is disposed on one sidewall 100L among the plurality of sidewalls 100L and is used for joining the container body 10 with the door (not shown in Figure) of the container and for protecting the plurality of thin substrates S within the interior of the container. Moreover, the side of base 100B of the container body that contacts the rotation base 50 includes a plurality of grooves (not shown in Figure) for being further assembled with a plurality of corresponding locating pillars 51 on the rotation base 50 to ensure that the container body 10 is securely fixed on the rotation base 50. As shown in FIG. 4B, the light beam transmitted by the optical component 30 can pass through the front opening 12 of the container body 10 for the measurement of pitch between thin substrates to be performed. Moreover, the thin substrate pitch measurement equipment further includes an operation interface 60 for the user to input all kinds of commands or parameters to complete the measurement needed. Then, referring to FIG. 5A, when the optical component 30 is driven to move upward from bottom or downward from top by the scanning device 40, if the optical component 30 and the thin substrate S under test is at the same height, the light beam transmitted by the light-transmitter 31 of the optical component 30 will be reflected back by the thin substrate S under test and detected by the light-receiver 32 of the optical component 30. However, as shown in FIG. 5B, if the optical component 30 is driven by the scanning device 40 and is located between thin substrates S, the light beam transmitted by the light-transmitter 31 of the optical component 30 will not be reflected by the thin substrate S under test and thus, the light-receiver 32 of the optical component 30 will not be able to detect the light beam. The scanning device 40 as described above can include a linear driver, such as a linear motor or electric sliding table, to reduce power loss when driving the optical component 30. The scanning device 40 drives the optical component 30 downward from top or upward from bottom to scan, and the speed of scanning can be adjusted according to different types of thin substrates S. For example, when the thin substrates S are wafers, since current distance between wafers in wafer container is 10 mm, the scanning device can drive the optical component 30 to scan downward from top or upward from bottom with 1~10 mm as unit for scanning, wherein 2~5 mm is in particular a preferred unit for scanning. If the user uses the measurement equipment of the present invention only for checking whether the plurality of wafers within the interior of the container body 10 exist or whether there is displacement of wafers, the user can choose to configure longer span as unit for the scanning of scanning device 40 to drive the optical component 30 to scan downward from top or upward from bottom, for example 5~10 mm. If the user uses the measurement equipment for accurately measuring distance between wafers or degree of sag of wafers, then the scanning device 40 needs to be configured with using shorter span as unit for scanning to drive the optical component 30 to scan downward from top or upward from bottom, for example 1~5 mm. Of course, thin substrates S can also be LCD glass substrates. LCD glass substrates have fairly large size, and thus it is easier for sag of substrates to occur. But as the pitch between LCD glass substrates is longer, when the present invention is used for measuring pitch between LCD glass substrates, the scanning device 40 can drive the optical component 30 to scan downward from top or upward from bottom with 1~50 mm as unit.

Figure 6A:
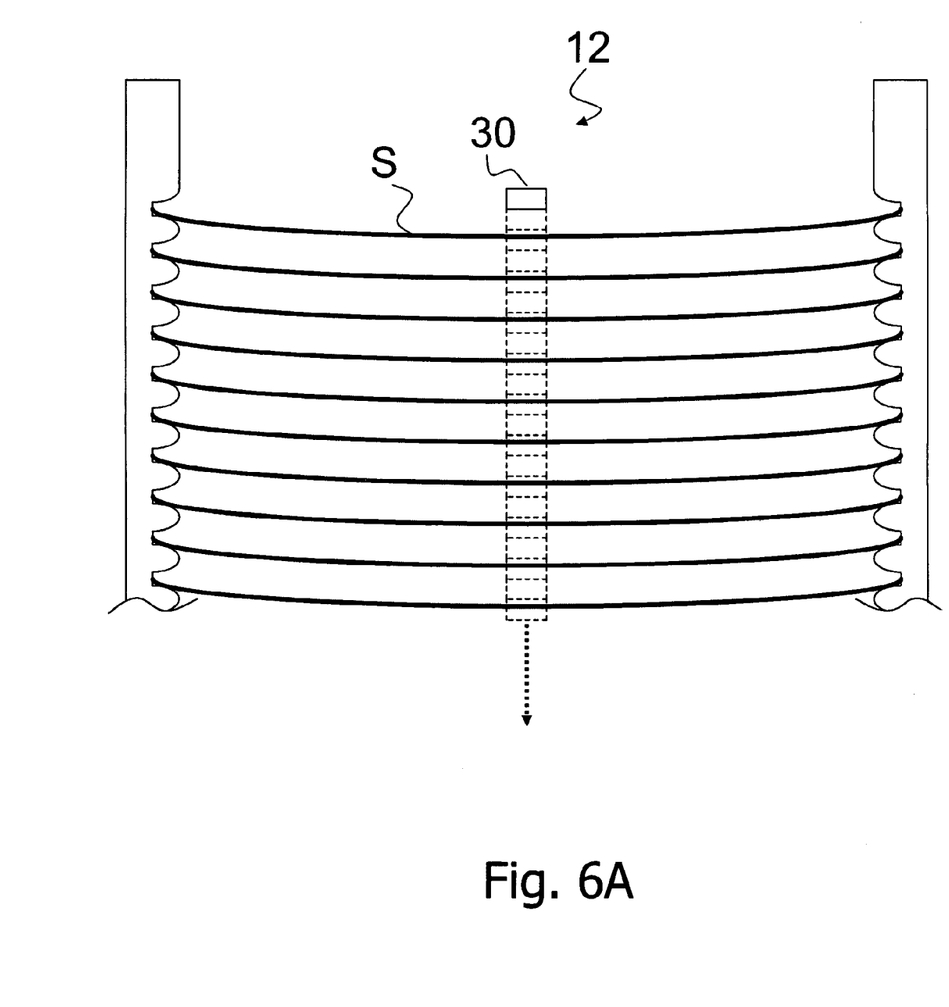
FIG. 6A~FIG. 6C are views of thin substrate pitch measurement equipment of the present invention when being used for measuring degree of sag of thin substrates.
Figure 6B:
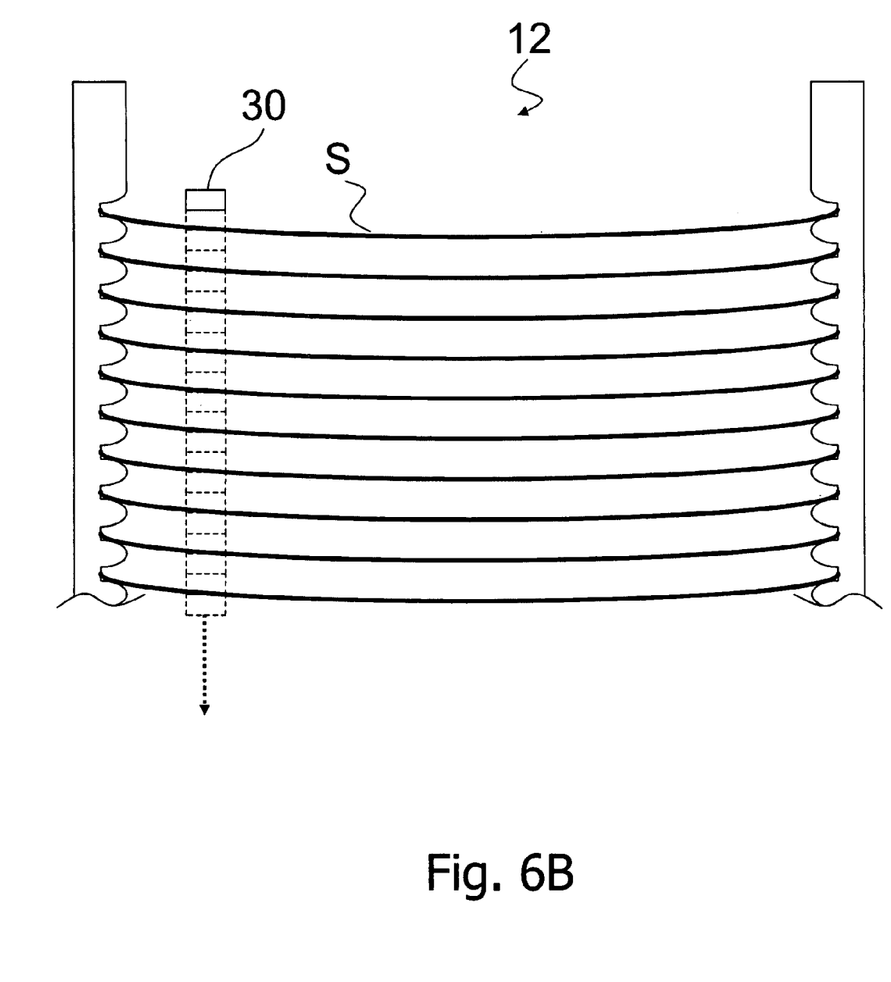
Figure 6C:
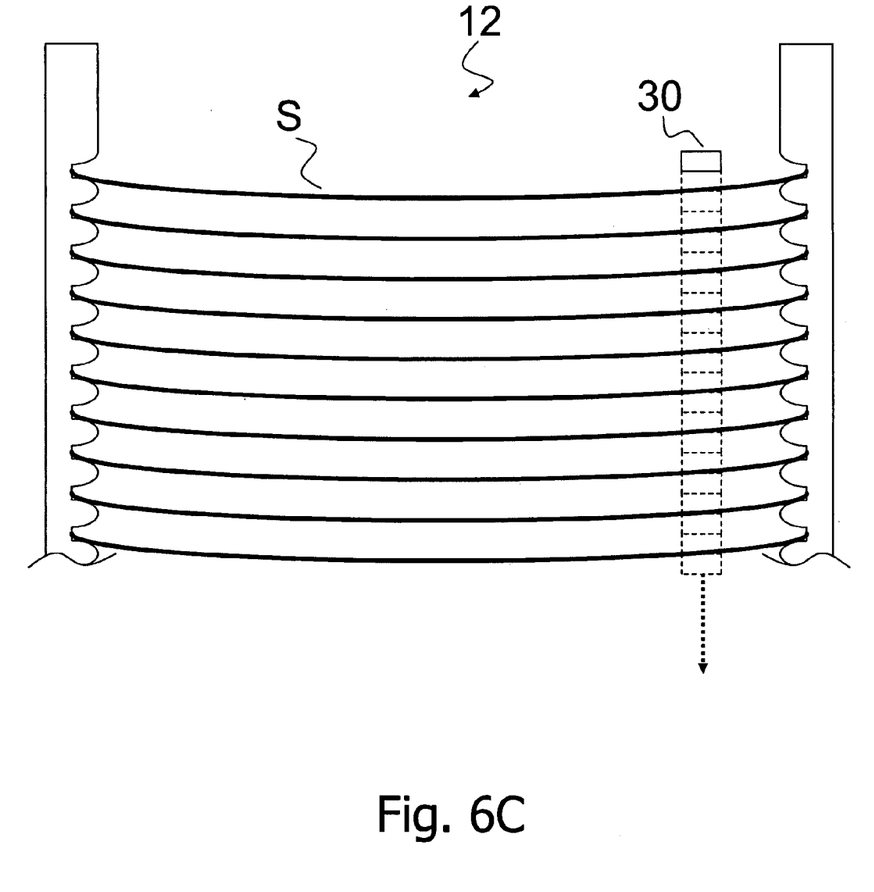
Figure 7:
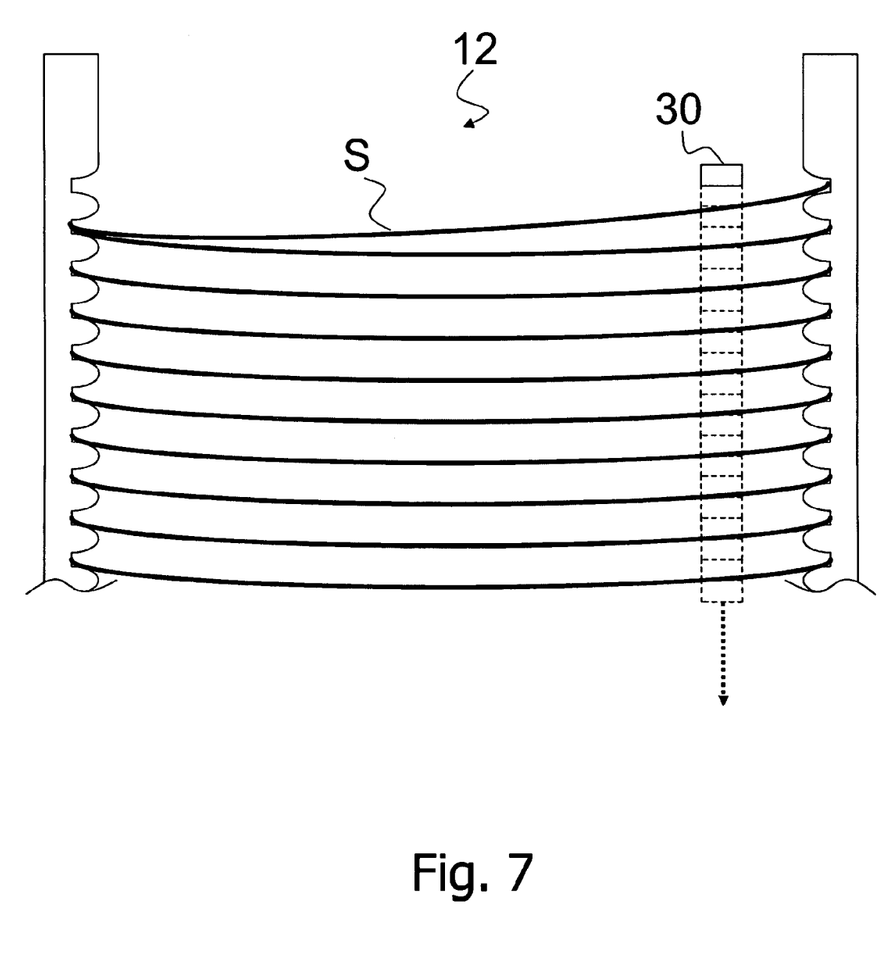
FIG. 7 is a view of thin substrate pitch measurement equipment of the present invention when being used for detecting displacement of thin substrates.

Then, referring to FIG. 6A~6C, which are views of measurement equipment of the present invention when being used for measuring degree of sag of thin substrates. When the container body 10 of thin substrate container is carried on the rotation base 50 in the beginning, the scanning device 40 and the optical component 30 face the central part of front opening 12 of the container body 10 (as shown in FIG. 4B and FIG. 6A). At this time, the scanning device 40 drives the optical component 30 downward from top (as shown in FIG. 6A) or upward from bottom to measure the position of each thin substrate S within the container body 10 and the distance between a thin substrate S and neighboring thin substrate S. Then, as shown in FIG. 6B, the rotation base 50 rotates the container body 10 to an angle for the scanning device 40 and the optical component 30 to be facing around a sidewall of the front opening 12 of the container body 10. At this time, the scanning device 40 also drives the optical component 30 downward from top (as shown in FIG. 6A) or upward from bottom to measure the position of each thin substrate S within the container body 10 and the distance between a thin substrate S and neighboring thin substrate S. Moreover, as shown in FIG. 6C, the rotation base 50 rotates the container body 10 to another angle for the scanning device 40 and the optical component 30 to be facing around another sidewall of the front opening 12 of the container body 10 and for further scanning to be performed. Since the scanning device 40 starts from the same standard point and drives the optical component 30 downward from top or upward from bottom to perform scanning with the same unit, thus, after comparing the results of measuring position of thin substrate in FIG. 6A~FIG. 6C as described above, the vertical difference between the part a thin substrate S on two sides of the front opening and the part of the same thin substrate S at the center of the front opening can be obtained, which is the degree of sag of thin substrate S. In addition, with the steps of measurement performed at center and on two sides of the front opening 12 of the container body 10, not only can the degree of sag of thin substrate S be measured, but whether the distance between the thin substrate S and neighboring thin substrate S is the same as expected figure or not and whether there is displacement of thin substrate S (as shown in FIG. 7) can also be known. And when the distance between thin substrates S is not the same as expected, person in charge of equipment can be notified to prevent the machine arm from entering and causing crack or damages to thin substrates in the following process.

Figure 8:
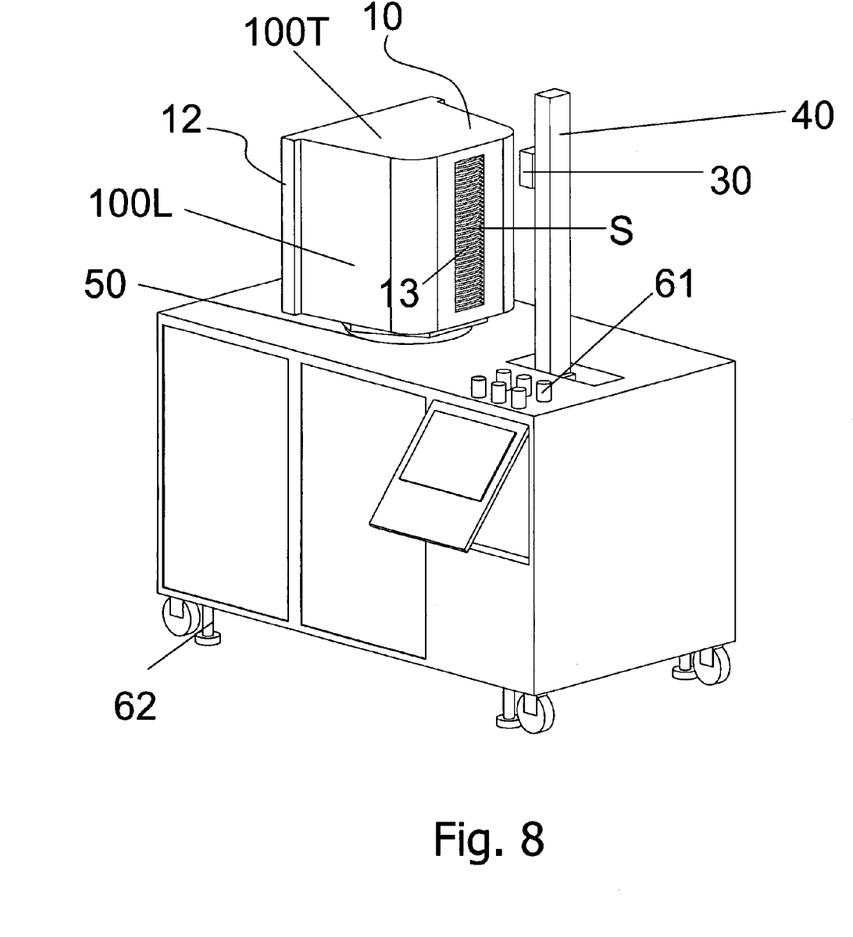
FIG. 8 is a view of thin substrate pitch measurement equipment of the present invention when measuring pitch between thin substrates with another method.
Figure 9:
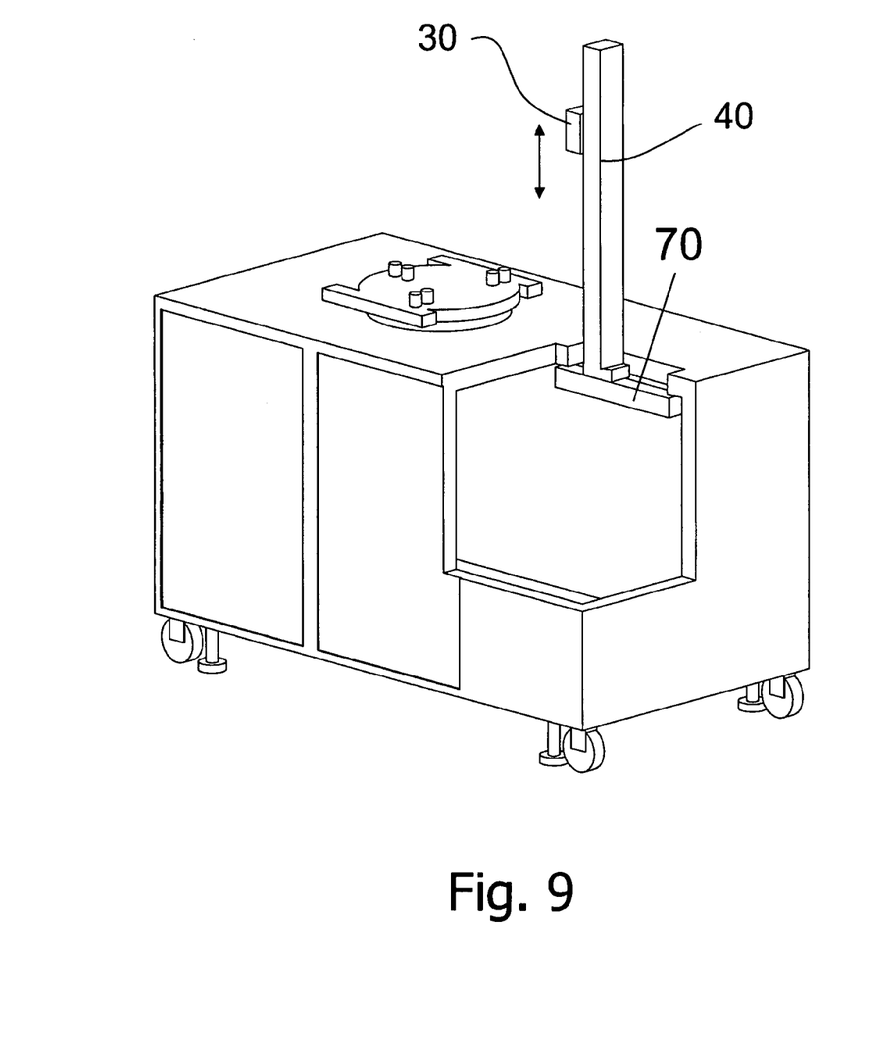
FIG. 9 is a view of another thin substrate pitch measurement equipment of the present invention.

Then, referring to FIG. 8, which is a view of thin substrate pitch measurement equipment of the present invention when measuring pitch between thin substrates with another method. The measurement can be performed not only via the front opening 12 of container body 10 of the thin substrate pitch measurement equipment of the present invention (as shown in FIG. 4B), but also via a back opening 13 on sidewall 100L opposite to the front opening 12 after the container body 10 is rotated 120~240 degrees by the rotation base 50. Wherein, as described above, the measurement via the back opening 13 of container body 10 can be performed via a hollow opening just like how the measurement via the front opening is performed, but the measurement via the back opening 13 can also be performed with transparent plastic embedded in the back opening 13, which does not affect the transmission and receipt of light beam of optical component 30. And during the process of thin substrate pitch measurement via back opening, the measurement can also be performed from more than one positions, the same as how the measurement via front opening is performed. Therefore, pitch measurement can be performed by the measurement equipment of the present invention via front opening 12 or back opening 13 of the container body 10. When there is vertical displacement of thin substrate S within the container body 10 with the front of thin substrate S higher than its back, the measured value of pitch obtained from measurement via front opening 12 of thin substrate pitch measurement equipment is larger than that obtained from measurement via back opening 13. Finally, the thin substrate pitch measurement equipment of the present invention can further include at least a status indicator light 61 and at least a buzzer. When abnormal pitch between thin substrates, displacement, or excessively large degree of sag of thin substrate is detected, the status indicator light 61 and buzzer described above will be activated to notify person in charge. And the thin substrate pitch measurement equipment can further include a plurality of horizontal meters and vibration proof device 62 to ensure that the measurement is performed horizontally in a stable environment and to prevent the accuracy of measurement from being affected by the vibration in the environment. Furthermore, as shown in FIG. 9, in addition to scanning device 40 that moves vertically, the thin substrate pitch measurement equipment can also include a horizontal movement device 70 for adjusting the distance between optical component 30 and container body 10 and ensuring that the optical component 30 can transmit light beam and receive light beam reflected from thin substrate accurately. What is to be emphasized here is that, the thin substrates measured by thin substrate pitch measurement equipment of the present invention can be wafers, LCD glass substrates, or other kinds of thin substrates (compact disk for example). Thus the name of measurement equipment can be changed to be wafer pitch measurement equipment, LCD glass substrate pitch measurement equipment, etc. according to the kind of thin substrate measured. And the thin substrate container as mentioned in the description can also be called wafer container, LCD glass substrate carrier, and etc. depending on the kind of thin substrate carried.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A thin substrate pitch measurement equipment for measuring pitch between a plurality of thin substrates stored in a container body, including:
   an optical component, for transmitting a light beam to a thin substrate in said container body and receiving light beam reflected from said thin substrate;
   a scanning device, for driving said optical component to move along vertical direction of said plurality of thin substrates; and
   a rotation base, for carrying and rotating said container body to a plurality of angles to measure pitch between said plurality of thin substrates.

2. The measurement equipment according to claim 1, wherein said optical component includes a light-transmitter and a light-receiver.

3. The measurement equipment according to claim 2, wherein said light beam provided by said light-transmitter is selected from one of the groups consisting of laser light, visible light and infrared light.

4. The measurement equipment according to claim 1, wherein a linear motor is used in said scanning device for driving said optical component to move along vertical direction of said thin substrates.

5. The measurement equipment according to claim 1, wherein an electric sliding table is used in said scanning device for driving said optical component to move along vertical direction of said thin substrates.

6. The measurement equipment according to claim 1, wherein said scanning device drives said optical component to move along vertical direction of said thin substrates with 1~50 mm as unit for scanning.

7. The measurement equipment according to claim 1, wherein said rotation base further includes a plurality of locating pillars and said container body further includes a plurality of grooves corresponding with said locating pillars for being joined with said plurality of locating pillars of said rotation base to fix said container body to said rotation base.

8. The measurement equipment according to claim 1, further including a horizontal movement device to horizontally drive said optical component closer to or farther from said plurality of thin substrates in said container body.

9. The measurement equipment according to claim 1, further including a vibration proof device, said vibration proof device preventing accuracy of measurement of pitch between said plurality of thin substrates performed by said measurement equipment from being affected by vibration in the environment.

10. A wafer pitch measurement equipment for measuring pitch between a plurality of wafers stored in a container body, including:
  an optical component, for transmitting a light beam to a wafer in said container body and receiving light beam reflected from said wafer;
  a scanning device, for driving said optical component to move along vertical direction of said plurality of wafers; and
  a rotation base, for carrying and rotating said container body to a plurality of angles to measure pitch between said plurality of wafers.

11. The measurement equipment according to claim 10, wherein said optical component includes a light-transmitter and a light-receiver.

12. The measurement equipment according to claim 11, wherein said light beam provided by said light-transmitter is selected from one of the groups consisting of laser light, visible light and infrared light.

13. The measurement equipment according to claim 11, wherein said light-receiver is selected from one of the groups consisting of laser light receiver, visible light receiver and infrared light receiver.

14. The measurement equipment according to claim 10, wherein a linear motor is used in said scanning device for driving said optical component to move along vertical direction of said wafers.

15. The measurement equipment according to claim 10, wherein an electric sliding table is used in said scanning device for driving said optical component to move along vertical direction of said wafers.

16. The measurement equipment according to claim 10, wherein said scanning device drives said optical component to move along vertical direction of said wafers with 1~10 mm as unit for scanning.

17. The measurement equipment according to claim 10, wherein said scanning device drives said optical component to move along vertical direction of said wafers with 2~5 mm as unit for scanning.

18. The measurement equipment according to claim 10, wherein said rotation base is able to rotate said container body more than 360 degrees.

19. The measurement equipment according to claim 10, wherein said rotation base further includes a plurality of locating pillars and said container body further includes a plurality of grooves corresponding with said locating pillars for being joined with said plurality of locating pillars of said rotation base to fix said container body to said rotation base.

20. The measurement equipment according to claim 10, wherein said container body carried by said rotation base includes a front opening to allow said light beam transmitted by said optical component to pass through.

21. The measurement equipment according to claim 20, wherein said rotation base rotates said container body to a plurality of angles for said light beam transmitted by said optical component to pass through said front opening of said container body at a plurality of angles.

22. The measurement equipment according to claim 10, further including a status indicator light, said status indicator light being activated when pitch between said plurality of wafers is not same as expected.

23. The measurement equipment according to claim 10, further including a buzzer, said buzzer being activated when pitch between said plurality of wafers is not same as expected.

24. The measurement equipment according to claim 10, further including a horizontal movement device to horizontally drive said optical component closer to or farther from said plurality of wafers in said container body.

25. The measurement equipment according to claim 10, further including a vibration proof device, said vibration proof device preventing accuracy of measurement of pitch between said plurality of wafers performed by said measurement equipment from being affected by vibration in the environment.

* * * * *